(12) United States Patent
Shaw et al.

(10) Patent No.: US 11,073,539 B2
(45) Date of Patent: Jul. 27, 2021

(54) SPLIT CORE CURRENT SENSOR

(71) Applicant: ABB Schweiz AG, Baden (CH)

(72) Inventors: Steven A. Shaw, Greenville, NC (US); Vivek Siddharth, Greenville, NC (US)

(73) Assignee: ABB Schweiz AG, Baden (CH)

( * ) Notice: Subject to any disclaimer, the term of this patent is extended or adjusted under 35 U.S.C. 154(b) by 169 days.

(21) Appl. No.: 16/186,091

(22) Filed: Nov. 9, 2018

(65) Prior Publication Data

US 2019/0146008 A1 May 16, 2019

Related U.S. Application Data

(60) Provisional application No. 62/584,500, filed on Nov. 10, 2017.

(51) Int. Cl.
*G01R 15/18* (2006.01)
*G01R 19/00* (2006.01)

(52) U.S. Cl.
CPC ......... *G01R 15/183* (2013.01); *G01R 15/186* (2013.01); *G01R 19/0092* (2013.01)

(58) Field of Classification Search
CPC .... G01R 15/183; G01R 15/186; G01R 19/00; G01R 1/22; G01R 15/18; G01R 15/181; H01F 38/30
See application file for complete search history.

(56) References Cited

U.S. PATENT DOCUMENTS

| | | |
|---|---|---|
| 3,584,299 A | 6/1971 | Csete |
| 4,048,605 A | 9/1977 | McCollum |
| 4,309,655 A | 1/1982 | Lienhard et al. |
| 9,607,749 B2 | 3/2017 | Cook et al. |
| 2004/0183522 A1* | 9/2004 | Gunn ................... G01R 15/185 324/126 |
| 2004/0257061 A1* | 12/2004 | George de Buda . G01R 15/186 324/117 R |
| 2008/0275657 A1 | 11/2008 | Hagmann |
| 2010/0301852 A1 | 12/2010 | Teppan et al. |
| 2012/0268108 A1 | 10/2012 | Hozoi et al. |
| 2013/0187636 A1 | 7/2013 | Kast et al. |

(Continued)

OTHER PUBLICATIONS

International Search Report and Written Opinion issued in corresponding international application No. PCT/US2018/060697, dated Mar. 29, 2019, 10 pp.

*Primary Examiner* — Jermele M Hollington
*Assistant Examiner* — Suresh K Rajaputra
(74) *Attorney, Agent, or Firm* — Taft Stettinius & Hollister LLP

(57) ABSTRACT

A split core current sensor a core subdivided into a first core section and a second core section, each of which have a first end and a second end. The first core section and the second core section are spaced apart by a gap. The sensor also includes a plurality of coil windings disposed about the core. A first coil winding is disposed proximate to the first end of the first core section; a second coil winding is disposed proximate to the second end of the first core section; a third coil winding is disposed proximate to the first end of the second core section; and a fourth coil winding is disposed proximate to a second end of the second core section. Each of the first core section and the second core section include a central portion disposed between the first and second ends that is free of coil windings.

22 Claims, 6 Drawing Sheets

(56) References Cited

U.S. PATENT DOCUMENTS

2014/0160820 A1    6/2014  McKinley
2015/0008903 A1*  1/2015  Javora .................... G01R 1/22
                                                            324/127
2019/0088411 A1*  3/2019  Zhi ..................... H01F 27/263

* cited by examiner

SPLIT CORE CURRENT SENSOR

TECHNICAL FIELD

The present application generally relates to sensors and more particularly, but not exclusively, to a split core current sensor.

BACKGROUND

Current sensors of various types remain an area of interest. Some existing systems have various shortcomings, drawbacks and disadvantages relative to certain applications. For example, some current transformer current sensors require that conductors be powered down and disconnected prior to installation of the current sensor. Accordingly, there remains a need for further contributions in this area of technology.

SUMMARY

One embodiment of the present invention is a unique sensor for measuring electrical current. Another embodiment is a unique split core current sensor. Another embodiment is a unique method of manufacturing a split core current sensor. Other embodiments include apparatuses, systems, devices, hardware, methods, and combinations for current sensors. Further embodiments, forms, features, aspects, benefits, and advantages of the present application shall become apparent from the description and figures provided herewith.

BRIEF DESCRIPTION OF THE FIGURES

The description herein makes reference to the accompanying drawings wherein like reference numerals refer to like parts throughout the several views, and wherein.

DETAILED DESCRIPTION OF THE ILLUSTRATIVE EMBODIMENTS

Figure 1:
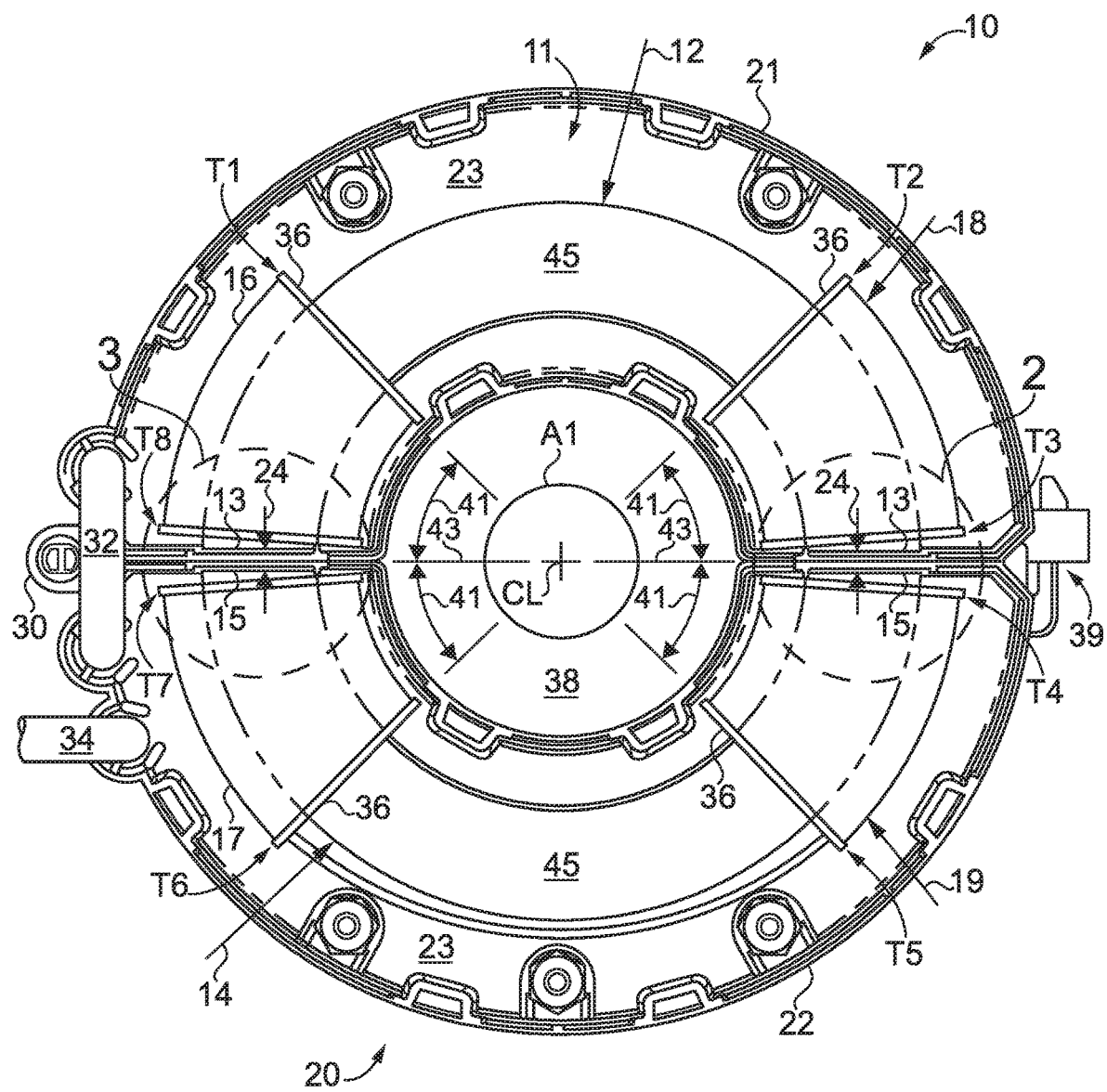
FIG. 1 schematically illustrates some aspects of a non-limiting example of a current sensor in accordance with an embodiment of the present invention.

For the purposes of promoting an understanding of the principles of the invention, reference will now be made to the embodiments illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates.

Figure 2:
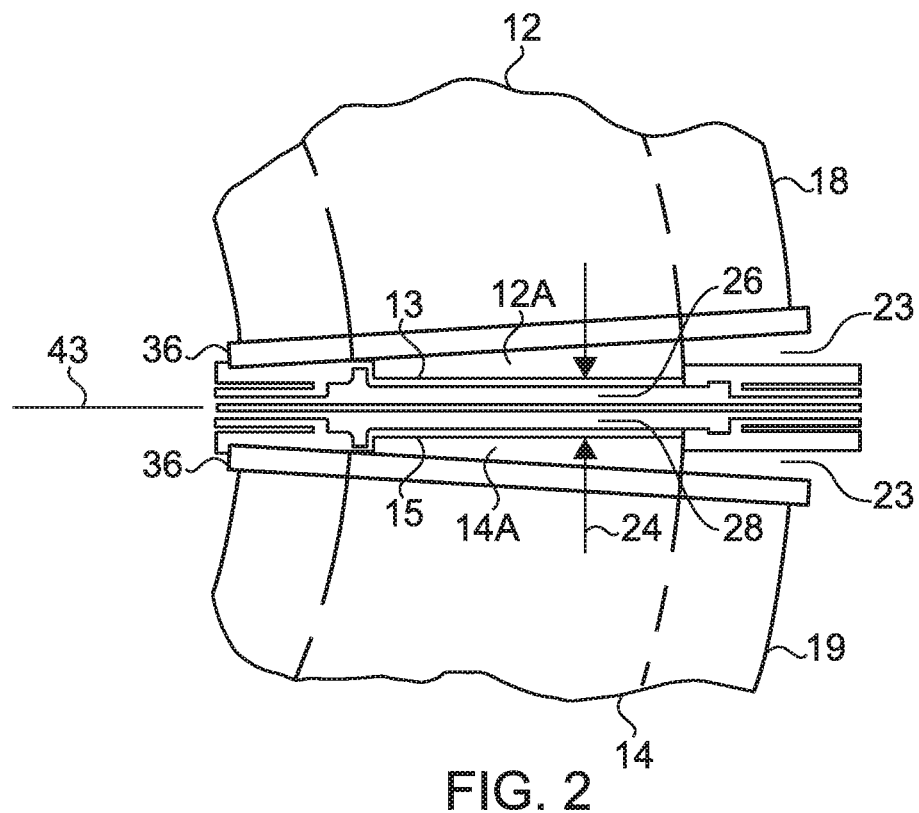
FIG. 2 illustrates an expanded view of a portion of FIG. 1.
Figure 3:
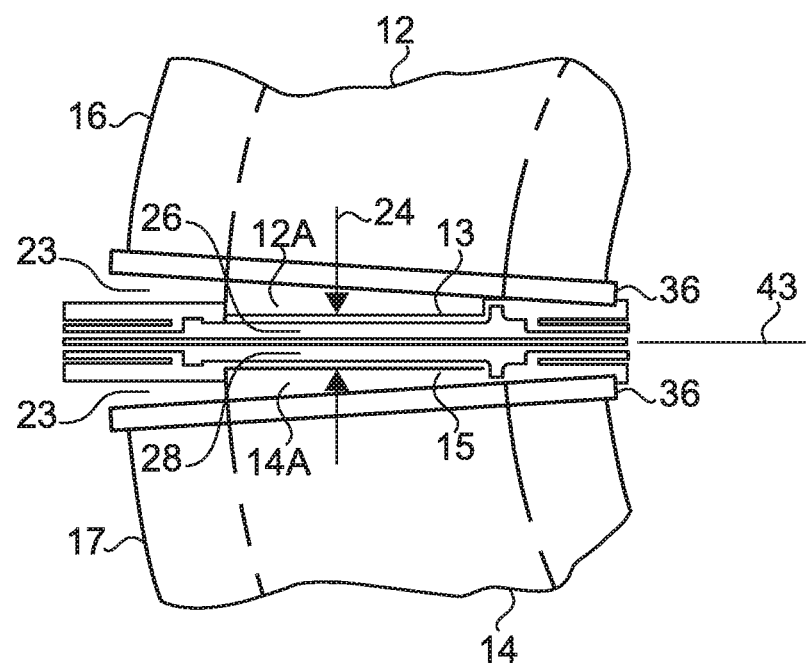
FIG. 3 illustrates an expanded view of a portion of FIG. 1

With reference to FIGS. 1-3, some aspects of a non-limiting example of a split core current sensor 10 are schematically illustrated in accordance with an embodiment of the present invention. FIGS. 1-3 illustrate split core current sensor 10 with a front face of a split core current sensor housing removed to illustrate certain features of the split core current sensor 10. In one form, split core current sensor 10 is a current transformer (CT) sensor. In the illustration of FIG. 1, split core current sensor 10 is depicted as being disposed about a conductor A1 for a power system, e.g., a power line conductor for one phase of a 3-phase power system having phase leg conductors A1, B1 and C1. Instances of split core current sensor 10 may be employed for measuring current in each conductor of any power system, and, for example, may be installed on all three phase conductors A1, B1 and C1. The power system may be at least partially in a vault below ground level, such as in a submersible application or in an underground application, or may be overhead power lines, or another type of installation that can benefit from a high accuracy current sensor 10 having ease of placement on or about a conductor.

Split core current sensor 10 includes a core 11. Core 11 is subdivided into two core sections 12, 14. In other embodiments, core 11 may be subdivided into a greater number of core sections. In one form, core 11 has a toroidal shape, e.g., is a toroid, and has a centerline CL perpendicular to the plane of view of FIG. 1. In other embodiments, core 11 may take other geometrical forms, and is not limited to being a toroid. In one form, core 11 has a square cross-section. In other embodiments, core 11 may have other cross-sectional shapes.

In one form, core sections 12, 14 are each semi-circular in shape, e.g., jointly forming a toroid. In other embodiments, core sections 12, 14 may have other geometrical forms. In one form, core 11 is formed of a high permeability (i.e., magnetic permeability) material, for example, M4 steel. Other materials may be used in other embodiments. In one form, core 11 is laminated, e.g., formed of spiral or curved laminations that are pressed or otherwise secured together. It should be understood that the core 11 and lamination shape/thickness may vary depending upon the application. In some embodiments, core 11 may be a low permeability core, such as a plastic core or an air core.

Core section 12 has two opposite ends 13, and core section 14 has two opposite ends 15. Ends 13 are on opposite sides of core section 12; ends 15 are on opposite sides of core section 14; and ends 13 and 15 are facing or opposing each other. A plurality of coil windings are disposed about each core section 12, 14. In the illustrated embodiments, two coil windings are disposed about core section 12, and two coil windings are disposed about core section 14. In other embodiments, additional coil windings may be employed.

As illustrated in FIGS. 1-3, mounted on and disposed about core section 12 are coil windings 16 and 18, which are mounted proximate to opposite ends 13 of core section 12, leaving a bare portion 45 of core section 12 between coil windings 16 and 18. Mounted on and disposed about core section 14 are coil windings 17 and 19, which are mounted proximate to opposite ends 15 of core section 14, leaving a bare portion 45 of core section 14 between coil windings 17 and 19. Thus, in the illustrated embodiment, there are four coil windings 16, 17, 18, 19 in which pairs of opposing coil windings are placed proximate to each other and the first and second opposing ends 13, 15 of the two core sections 12, 14. For example, coil windings 16, 17 are disposed proximate to each other and to opposing ends 13, 15 on one side, e.g., the left-hand side, of split core current sensor 10; and coil windings 18, 19 are disposed proximate to each other and to opposing ends 13, 15 on an opposite side, i.e., the right-hand side, of split core current sensor 10. In one form, coil windings 16, 17, 18, 19 are formed of copper. In other embodiments, coil windings 16, 17, 18, 19 may be formed of copper, aluminum and/or another type of conductive material. Coil windings 16, 17, 18, 19 are formed as a plurality of turns about core 11. In some embodiments, the turns may be formed about a coil form 36, such as a bobbin, and, e.g., subsequently mounted on core 11.

Coil windings 16, 17, 18, 19 have respective terminals T1, T2, T3, T4, T5, T6, T7, and T8. In one non-limiting example, coil windings 16, 17, 18, 19 are coupled in series as follows: terminal T1 is coupled to terminal T2; terminals T3 and T4 provide the sensor signal out, e.g., via output cable 34; terminal T5 is coupled to terminal T6, and terminal T7 is coupled to terminal T8. In other embodiments, other terminals may provide the signal out, and terminals T3 and T4 may be coupled.

In some embodiments, split core current sensor 10 may include a housing 20 for receiving and protecting the core 11 sections 12, 14, the coil windings 16, 17, 18, 19 and associated wiring, connections and other components of split core current sensor 10. Housing 20 is formed of a low magnetic permeability material, such as plastic. In other embodiments, epoxy or another polymer may be employed to form housing 20. In some embodiments, housing 20 is also constructed to receive a waterproof resin 23 that encapsulates and hermetically seals core 11 sections 12, 14, coil windings 16, 17, 18, 19 and associated wiring, connections and other components of split core current sensor 10. In one form, housing 20 is subdivided into housing sections 21 and 22. Housing section 21 is constructed to receive core section 12, coil windings 16, 18 and a portion of the waterproof resin 23 encapsulating and hermetically sealing the core section 12 and coil windings 16, 18 within housing section 21. Housing section 22 is constructed to receive core section 14, coil windings 17, 19 and a portion of the waterproof resin 23 encapsulating and hermetically sealing core section 14 and coil windings 17, 19 within housing section 22.

The core sections 12, 14 are opened, such as by a hinge 30 between housing sections 21, 22 that allows placement of the split core current sensor 10 around a conductor, such as conductor A1. For example, housing sections 21, 22 may be angularly displaced apart about hinge 30 from each other to admit the conductor, and then closed, leaving an opening 38 in the middle of split core current sensor 10 in which is disposed or admitted the conductor, e.g., conductor A1. A latch 39 may be used to secure split core current sensor 10 in a closed position. A jumper cable 32 may electrically couple the two halves of split core current sensor 10 together, e.g., coupling terminals T7 and T8. An output cable 34 may be used to deliver the output signal from split core current sensor 10 to a desired location/device/system. As a CT current sensor, during operation, the conductor, e.g., conductor A1, acts as a primary conductor in relation to coil windings 16, 17, 18, 19, which function as secondary coils to generate the output signal of split core current sensor 10.

In some embodiments, a resistor and/or other electrical components may be employed to convert the output of coil windings 16, 17, 18, 19 into a desired form, e.g., a voltage, and/or to tune the accuracy ratio and the voltage or current signal so that the signal is proportional to the primary current in the conductor, e.g., A1. In one example, the split core current sensor provides an output signal of 10 volts in response to a conductor A1 current value of 600 Amps. The output signal and the current flow in the conductor may vary with the needs of the particular application. In some embodiments, a gas discharge tube (not shown) may be provided to limit the amount of voltage supplied to a controller in the event of an overcurrent condition.

Ends 13 are spaced apart from ends 15, and hence, disposed between opposing ends 13 and 15 of core sections 12, 14 is a gap 24 that separates each end 13 from a corresponding end 15. Gap 24 is a low magnetic permeability gap, and hence may be referred to as an air gap. End walls 26, 28 of housing sections 21, 22 are disposed in gap 24, and also separate each end wall 13 from each corresponding end wall 15, and protect the end walls 13, 15. Small portions 12A and 14A of core sections 12 and 14 may extend outward from coil windings 16, 17, 18, 19 to end walls 26, 28. In one form, gap 24 is 0.12 inches, and hence, the thickness of end walls 26 and 28 are 0.060 inches each. In other embodiments, the width of gap 24 and the thickness of end walls 26, 28 may vary with the needs of the application.

Housing 20 is impervious to the intrusion of water and moisture due to the encapsulation of core sections 12, 14 of core 11 and coil windings 16, 17, 18, 19 in a waterproof resin and resulting hermetic seal. The split core current sensor 10 of the present disclosure does not corrode, wear or rust as was previously experienced in split core sensors having exposed core section ends.

In the presence of other conductors, e.g., other phase leg conductors in a 3-phase system, or certain other electrical conductors or electric or electronic components, devices or systems, cross talk may be introduced into one or more coil windings 16, 17, 18, 19. The windings 16, 17, 18 and 19 are constructed and interconnected in a manner that mitigates and compensates for the effects of cross talk. In one aspect, each coil winding 16, 17, 18, 19 extends, e.g., circumferentially, along the length of a respective core segment by an angle 41, as measured, for example, from the center 43 of air gap 24. Angle 41 is an oblique angle. The inventors have determined that particular angles are most conducive to mitigating and compensating for the effect of cross talk. Too small an angle 41 may result in a situation where the coil windings do not have enough turns to generate an adequate output signal, and thus, the minimum magnitude of angle 41 varies based on how strong an output signal is desired or required. The maximum magnitude of angle 41 has a significant effect on the mitigation and compensation for the effect of cross talk. An angle 41 with a magnitude of 60° or less is preferred. More preferred is an angle 41 with a magnitude of 50° or less. Most preferred is an angle 41 with a magnitude of 45° or less. In a particular example, the magnitude of angle 41 for each coil winding 16, 17, 18, 19 is 42°.

In another measure, each of core sections 12, 14 includes a bare portion 45 that is not covered by coil windings 16, 17, 18, or 19, which is also referred to as a central portion 45 disposed between respective ends 13 or ends 15, that is free of or devoid of coil windings. Bare portion 45 of core section 12 is disposed between coil windings 16 and 18. Bare portion 45 of core section 14 is disposed between coil windings 17 and 19. The inventors have determined that too small a bare portion 45 may result in the effects of cross talk not being sufficiently mitigated and compensated for. In accordance therewith, a bare portion 45 having a surface area greater than or equal to 30% of the total surface area of the respective core section 12, 14 is preferred. More preferred is a bare portion 45 having a surface area greater than or equal to 40% of the total surface area of the respective core section 12, 14. Most preferred is a bare portion 45 having a surface area greater than or equal to 50% of the total surface area of the respective core section 12, 14.

In one embodiment, each individual coil winding 16, 17, 18, 19 occupies about 25% of the surface area of the respective core section 12, 14 to which the respective coil windings 16, 17, 18, 19 are mounted. Thus, about 50 percent of each core section 12, 14 and 50% of the entire surface area of the core 11 is occupied by coil windings 16, 17, 18, 19, and about 50% of the surface of core 11 is formed of bare portions 45.

The coil windings 16, 17, 18, 19 are coupled in series, e.g., as set forth above. Output cable 34 is coupled to the coil windings to provide an output signal for the split core current sensor 10. The output signal may be further communicated to other devices in the power system, such as devices nearby or remote from the location of the split core current sensor 10. In some embodiments, jumper cable 32 is provided to couple coil windings 16, 17 together, although in other embodiments, the split core current sensor 10 may be provided without the jumper cable 32, and achieve the desired effect by having the coil windings 16, 17, 18, 19 coupled in series.

In some embodiments, split core current sensor 10 is able to achieve a measurement accuracy error of less than 1% due to the mitigation of cross talk near the air gap 24 between the core sections 12, 14. The mitigation of cross talk is achieved by the location and extent of the coil windings 16, 17, 18, 19 proximate to the air gap 24. The symmetry of the coil winding 16, 17, 18, 19 locations on the core 11 and proximate to the air gap 24, in conjunction with the series coupling of the coil windings and the appropriate angle 41 or coil winding surface area coverage allows the cross talk effect to be cancelled out. In particular, the symmetry between the pair of coil windings 16, 17 and the pair of coil windings 18, 19 plays a role in mitigating and compensating for the cross-talk effect at the air gap 24 at the core 11 center line 43, along with other considerations mentioned herein, including the series coupling of the coil windings 16, 17, 18, 19.

The coil windings 16, 17, 18, 19 each have a side that is located at the angle 41 from center line 43 of air gap 24 or at angle 41 extending to the center line 43, where the respective coil windings 16, 17, 18, 19 are proximate to one another. The placement of the coil windings 16, 17, 18, 19 provides a uniform distribution of magnetic flux lines 50 (FIG. 4) near the center line of the core 11 and accuracy of at least 99% in current measurement in some embodiments, i.e., the current measurement accuracy error of less than one percent in some embodiments. In the coil windings 16, 18 arrangement of the split core current sensor 10, part of the flux goes to air and part of the flux goes to the core 11.

Figure 4:
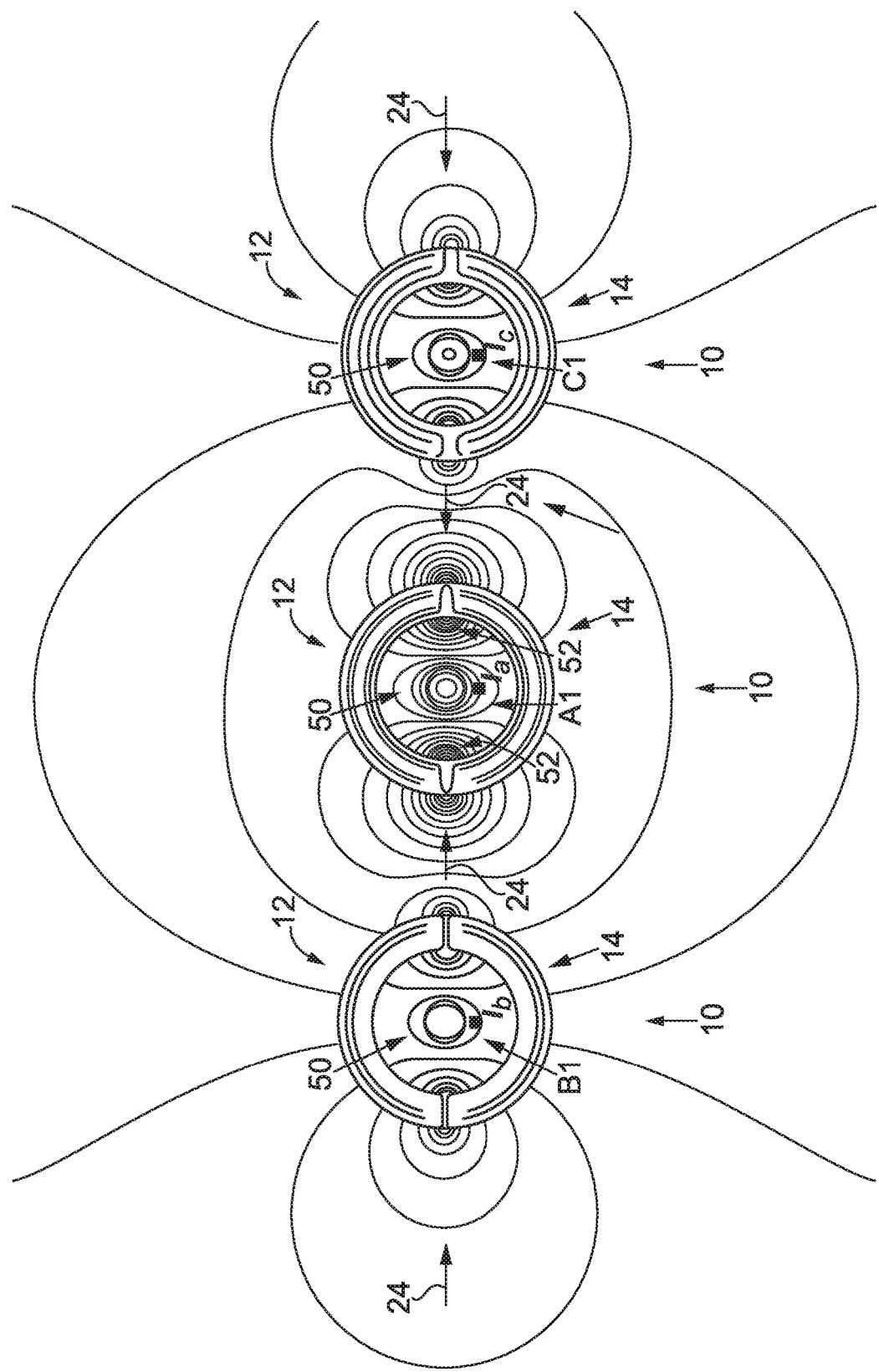
FIG. 4 is an illustration of a non-limiting example of the flux lines experienced in split core sensors installed onto adjacent phase conductors of a 3-phase system when current is highest in the center phase.

Referring to FIG. 4, an illustration of a non-limiting example of the flux lines experienced in split core sensors installed onto adjacent phase conductors A1, B1 and C1 of a 3-phase system is depicted. Peak current for each conductor is 600 A×√2 in the example of FIG. 4. Current is at the maximum in the center phase A1, illustrated as current $I_a$. The current in conductors B1 and C1, that is, $I_b$ and $I_c$, respectively, is negative and at a lower magnitude than $I_a$, e.g., 50% of the magnitude of $I_a$. In the depiction of FIG. 4, the density of flux lines in air gaps 24 may obscure the gap 24. The impact of the coil windings 16, 17, 18, 19 placement on the magnetic flux pattern as it travels through a high permeability path (i.e., through the core 11) is shown. Near the air gap 24, the flux lines 52 bulge out due to the low permeability of the gap 24, and then after passing through the air gap, they reach the other half of the core, and they converge again into the high permeability path of the other core section. The impact of cross talk, unlike in known current sensors, is minimized by the coil winding 16, 17, 18, 19 size (e.g., of angle 41) and placement of the present disclosure, and the series coupling. Placing the coil windings near the gap 24 gives the advantage that external flux or stray flux is not attracted in this region, and so there is less effect of the cross talk.

Figure 5:
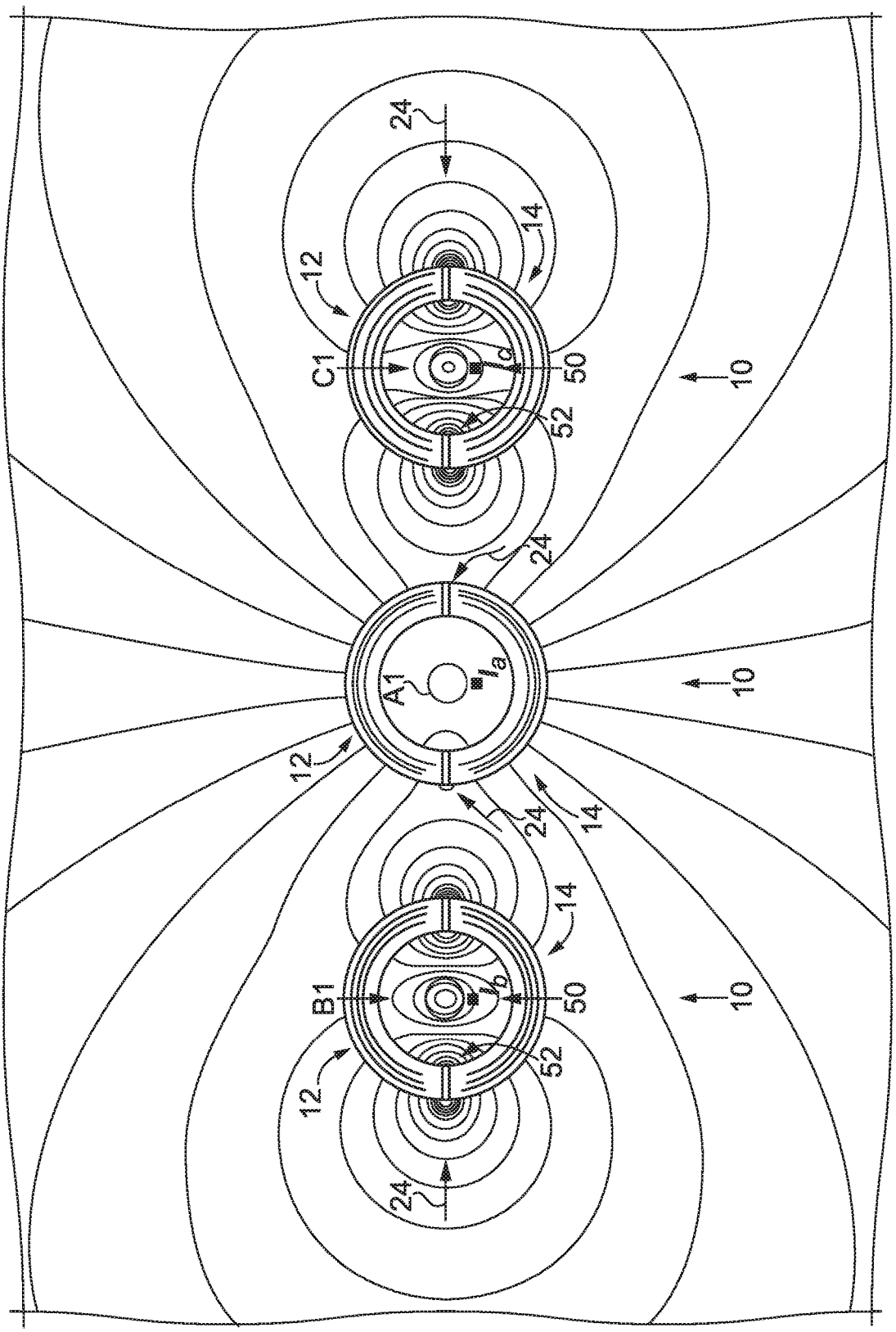
FIG. 5 is an illustration of a non-limiting example of the flux lines experienced in split core sensors installed onto adjacent phase conductors of a 3-phase system when zero current is present in the center phase and equal and opposite current is present in other phases.

Referring to FIG. 5, an illustration of a non-limiting example of the flux lines experienced in split core sensors installed onto adjacent phase conductors of a 3-phase system when zero current is present in the center phase A1 and equal and opposite current is present in phases B1 and C1 is depicted. It is observed that flux lines are attracted by the high permeability path and go through core section 12 and come out at core section 14. However, the flux lines 52 bulge out at gap 24 due to the low permeability of the air gap 24.

Figure 6A:
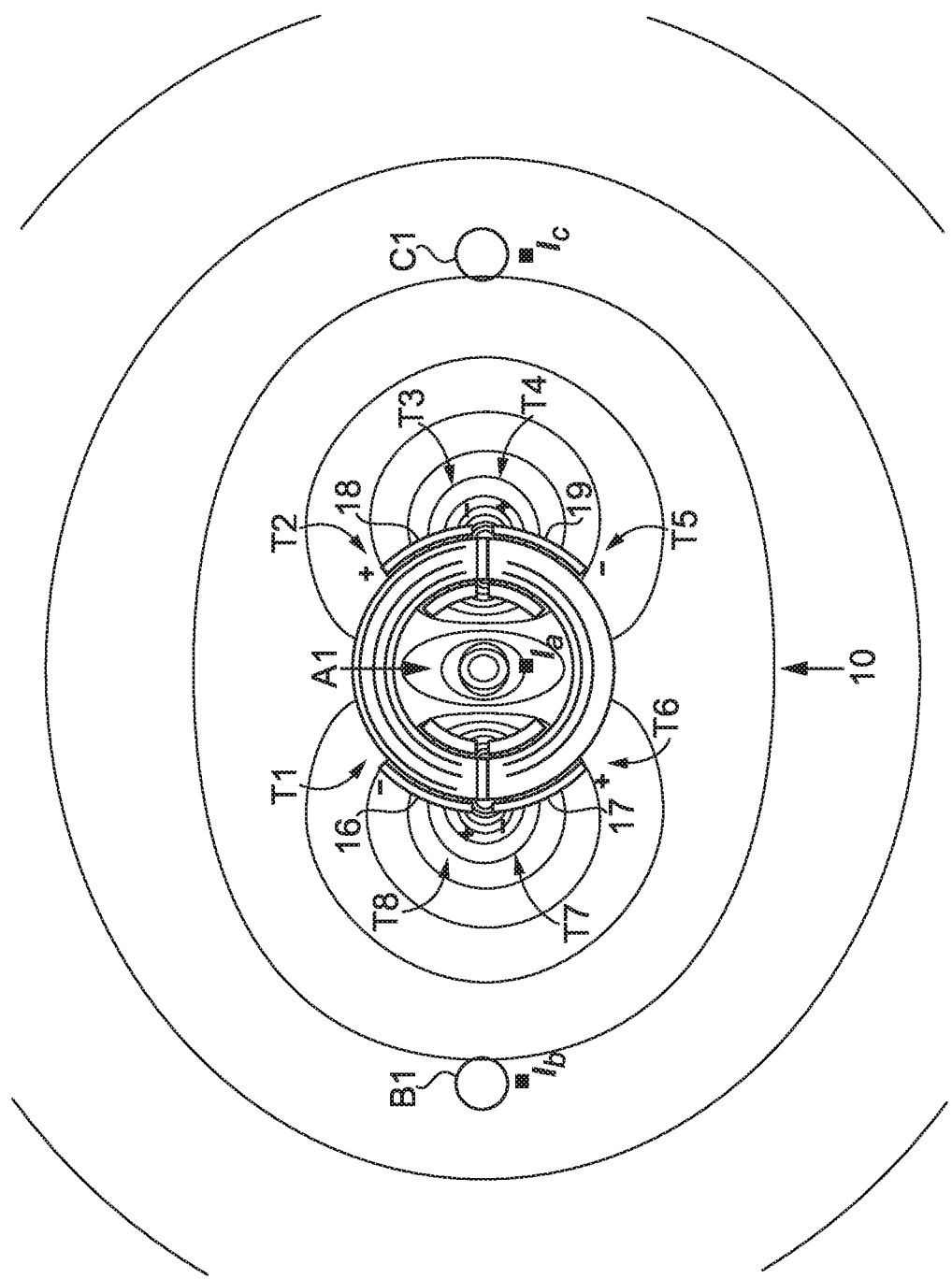
FIGS. 6A and 6B illustrate aspects of non-limiting examples of a split core current sensor disposed on a middle conductor of a 3-phase system with two adjacent conductors under different current conditions, and illustrates some aspects of a non-limiting example of elimination of the effects of cross talk in accordance with an embodiment of the present invention.
Figure 6B:
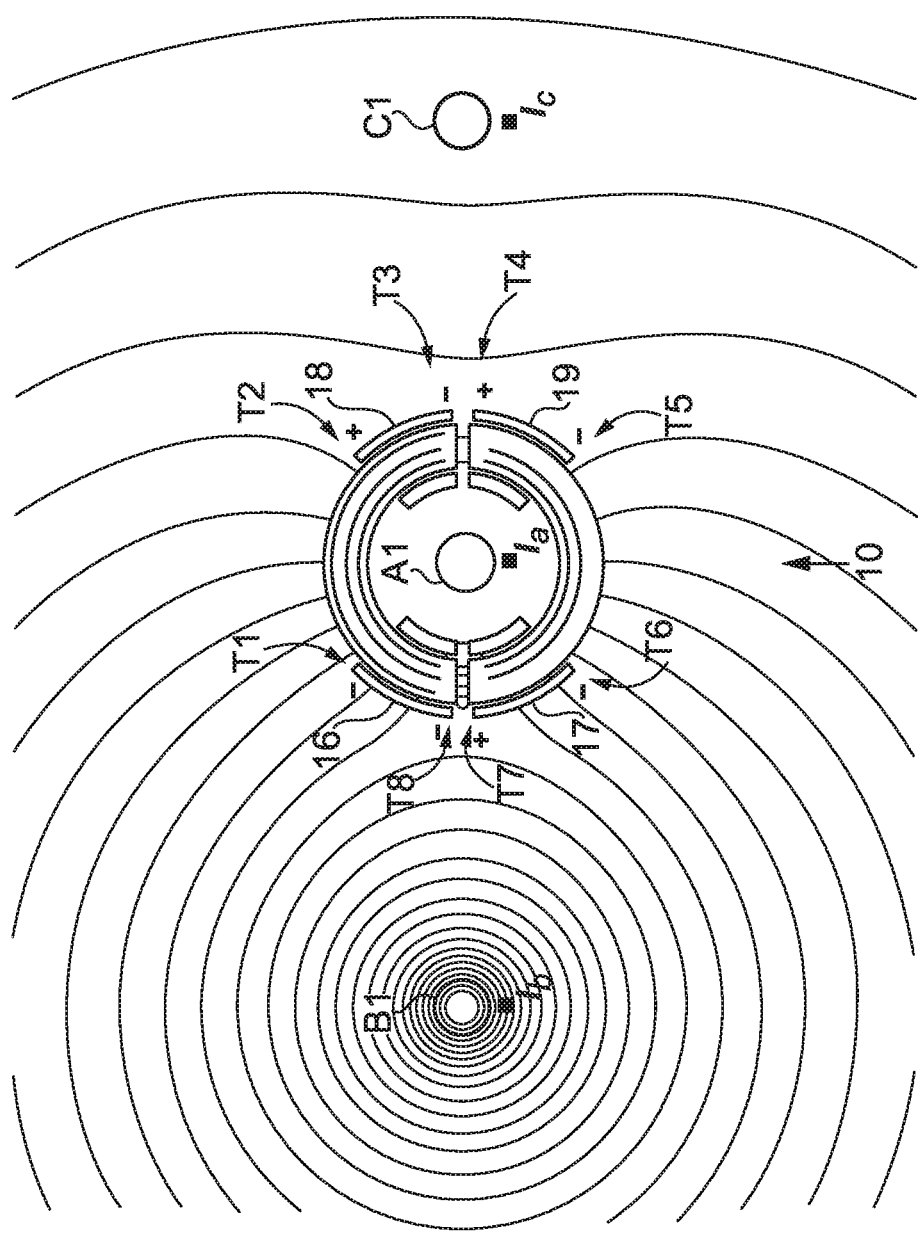

FIGS. 6A and 6B illustrate aspects of non-limiting examples of a split core current sensor disposed on a middle conductor of a 3-phase system with two adjacent conductors under different current conditions, and illustrate some aspects of a non-limiting example of elimination of the effects of cross talk in accordance with an embodiment of the present invention. The electrical current conditions in FIGS. 6A and 6B are hypothetical in nature, and do not occur in conventional 3-phase power systems, but rather, are used to illustrate how one aspect of the present disclosure mitigates and compensates for the effects of cross talk. In the depiction of FIG. 6A, the current $I_a$ in conductor A1 is at the maximum of 600 A×√2. However, current $I_b$ and $I_c$ in conductors B1 and C1, respectively, is zero. Thus, in the depiction of FIG. 6A, there is no cross talk adversely affecting coil windings 16, 17, 18, 19, since the adjacent conductors are not carrying current. The polarity of the coil windings 16, 17, 18, 19 at terminals T1, T2, T3, T4, T5, T6, T7 and T8 is seen in FIG. 6A as being −, +, −, +, −, +, − and +, respectively.

In the depiction of FIG. 6B, the current $I_a$ and $I_c$ in conductors A1 and C1, respectively, is zero. However, the current $I_b$ in conductor B1 is at the maximum value causing cross talk effects in coil windings 16, 17, 18, 19. The effect of the cross talk is to tend to reverse the polarity of coils 16 and 17, e.g., so that polarities at terminals T1, T2, T3, T4, T5, T6, T7 and T8 would tend towards being +, +, −, +, −, −, +, −, respectively. However, because the coil windings 16, 17, 18, 19 are coupled in series, e.g., as set forth herein, the effect of the cross talk is canceled out.

Embodiments of the present invention include a sensor for measuring electrical current in an elongated conductor, comprising: a core formed of at least two core sections, wherein each core section has first and second ends; and at least two coil windings mounted on each core section, one of the coil windings mounted proximate to the first end of a respective core section and one of the coil windings mounted proximate to the second end of the respective core section, whereby each of the first and second ends have coil windings of an opposing core section mounted proximate thereto, wherein the coil windings on each core section are spaced apart from each other along each core section, leaving a central portion of each core section free of coil windings, wherein the coil windings are connected together in series; and wherein the coil windings of the first core section are proximate to the coil windings of the second core section across an air gap disposed between the core sections.

In a refinement, a side of each of the coil windings is located at an oblique angle with respect to a center line of the core where the two core sections meet.

In another refinement, the core is toroidal.

In yet another refinement, the current measurement accuracy error for the sensor is less than one percent.

In still another refinement, a half of an outer surface are of the core is occupied by the coil windings.

In yet still another refinement, the sensor, disposed in proximity to one or more other conductors in addition to the elongated conductor, wherein magnetic flux lines are formed in the presence of the one or more other conductors, and wherein the magnetic flux lines bulge proximate to the air gap between the first and second core sections, and converge to a high permeability path in the first core section and/or the second core section.

In a further refinement, the sensor further comprises a housing constructed to receive the core sections and the coil windings.

Embodiments of the present invention include a split core current sensor for sensing a current in a conductor, comprising: a core subdivided into a first core section and a second core section, each of the first core section and the second core section having a first end and a second end, wherein the first core section and the second core section are spaced apart from each other by a gap that separates the first end of the first core section from the first end of the second core section and separates the second end of the first core section from the second end of the second core section; a plurality of coil windings disposed about the core, wherein at least a first coil winding of the plurality of coil windings is disposed proximate to the first end of the first core section; at least a second coil winding of the plurality of coil windings is disposed proximate to the second end of the first core section; and least a third coil winding of the plurality of coil windings is disposed proximate to the first end of the second core section; and at least a fourth coil winding of the plurality of coil windings is disposed proximate to a second end of the second core section, wherein each of the first core section and the second core section include a central portion disposed between the first and second ends that is free of coil windings.

In a refinement, the coil windings are coupled in series.

In another refinement, each coil winding extends circumferentially along a respective core section 60° or less.

In yet another refinement, each coil winding extends circumferentially along a respective core section 50° or less.

In still another refinement, each coil winding extends circumferentially along a respective core section 45° or less.

In yet still another refinement, each coil winding extends circumferentially along a respective core section approximately 42°.

In a further refinement, the central portion of the first core section and/or the second core section has a surface area of greater than or equal to 30% of a total surface area of the respective first core section and/or second core section.

In a yet further refinement, the central portion of the first core section and/or the second core section has a surface area of greater than or equal to 40% of a total surface area of the respective first core section and/or second core section.

In a still further refinement, the central portion of the first core section and/or the second core section has a surface area of greater than or equal to 50% of a total surface area of the respective first core section and/or second core section.

In a yet still further refinement, the split core current sensor is a toroid.

In another further refinement, the split core current sensor further comprises a housing constructed to receive the first and second core sections and the plurality of coil windings; and a waterproof resin encapsulating and hermetically sealing the first and second core sections and the plurality of coil windings within the housing.

In yet another further refinement, the housing is subdivided into a first housing section and a second housing section; wherein: the first housing section is constructed to receive the first core section, a first portion of the plurality of coil windings and a first portion of the waterproof resin encapsulating and hermetically sealing the first core section and the first portion of the plurality of coil windings within the first housing section; and the second housing section is constructed to receive the second core section, a second portion of the plurality of coil windings and a second portion of the waterproof resin encapsulating and hermetically sealing the second core section and the second portion of the plurality of coil windings within the second housing section.

Embodiments of the present invention include a method of manufacturing a split core current sensor, comprising: a). providing a core having two core sections, each section having first and second ends; b). providing a plurality of coil windings, and mounting at least a first of the coil windings proximate the first end of one of the core sections; mounting at least a second of the coil windings proximate to the second end of the one of the core sections; mounting at least a third of the coil windings proximate to the first end of another core section; and mounting at least a fourth of the coil windings proximate to the second end of the other core section; and c). connecting the coil windings together in series.

In a refinement, the method further comprises d). receiving the core sections and coil windings mounted thereon in a housing formed of two sections.

In another refinement, the method further comprises e). encapsulating the core sections and corresponding coil windings together with the housing sections with a waterproof resin.

While the invention has been illustrated and described in detail in the drawings and foregoing description, the same is to be considered as illustrative and not restrictive in character, it being understood that only the preferred embodiments have been shown and described and that all changes and modifications that come within the spirit of the inventions are desired to be protected. It should be understood that while the use of words such as preferable, preferably, preferred or more preferred utilized in the description above indicate that the feature so described may be more desirable, it nonetheless may not be necessary and embodiments lacking the same may be contemplated as within the scope of the invention, the scope being defined by the claims that follow. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary.

Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

What is claimed is:

1. A sensor for measuring electrical current in an elongated conductor, comprising:
a core formed of at least two core sections, wherein each core section has a length extending from a first end to a second end thereof and the at least two core sections are configured to be positioned around the elongated conductor with the first ends on one side of the elongated conductor and the second ends on an opposite side of the elongated conductor; and
at least two coil windings mounted on each core section, one of the coil windings mounted proximate to the first end of a respective core section and one of the coil windings mounted proximate to the second end of the respective core section, whereby each of the first and second ends have coil windings of an opposing core section mounted proximate thereto, wherein each of the coil windings on each core section is formed as a plurality of turns that extend about and circumferentially along the length of a respective segment of the core section from a first terminal end of the coil winding adjacent a corresponding one of the first and second ends of the core section toward the opposite one of the first and second ends of the core section to an opposite second terminal end of the coil winding so that the second terminal ends of the coil windings on each core section are spaced apart from each other along each core section, leaving a central portion of each core section between each of the second terminal ends free of coil windings,
wherein the coil windings are connected together in series; and
wherein the coil windings of the first core section are proximate to the coil windings of the second core section across an air gap disposed between the core sections.

2. The sensor of claim 1, wherein a side of each of the coil windings is located at an oblique angle with respect to a center line of the core where the two core sections meet.

3. The sensor of claim 1, wherein the core is toroidal.

4. The sensor of claim 1, wherein the current measurement accuracy error for the sensor is less than one percent.

5. The sensor of claim 1, wherein a half of an outer surface area of the core is occupied by the coil windings.

6. The sensor of claim 1, disposed in proximity to one or more other conductors in addition to the elongated conductor, wherein magnetic flux lines are formed in the presence of the one or more other conductors, and wherein the magnetic flux lines bulge proximate to the air gap between the first and second core sections, and converge to a high permeability path in the first core section and/or the second core section.

7. The sensor of claim 1, further comprising a housing constructed to receive the core sections and the coil windings.

8. A split core current sensor for sensing a current in a conductor, comprising:
a core subdivided into a first core section and a second core section, each of the first core section and the second core section having a length extending from a first end to a second end thereof, wherein the first core section and the second core section are spaced apart from each other by a gap that separates the first end of the first core section from the first end of the second core section and separates the second end of the first core section from the second end of the second core section, wherein the at least two core sections are configured to be positioned around the conductor with the first ends on one side of the conductor and the second ends on an opposite side of the conductor;
a plurality of coil windings disposed about the core, each of the plurality of coil windings is formed as a plurality of turns that extend about and circumferentially along the length of a respective segment of one of the first and second core sections from a first terminal end of the coil winding adjacent the gap to an opposite second terminal end of the coil winding, wherein at least a first coil winding of the plurality of coil windings is disposed proximate to the first end of the first core section; at least a second coil winding of the plurality of coil windings is disposed proximate to the second end of the first core section; and least a third coil winding of the plurality of coil windings is disposed proximate to the first end of the second core section; and at least a fourth coil winding of the plurality of coil windings is disposed proximate to a second end of the second core section,
wherein each of the first core section and the second core section include a central portion disposed between the first and second ends that is free of coil windings so that the second terminals ends of the coil windings on each of the first core section and the second core section are spaced apart from each other by the central portion that is free of coil windings.

9. The split core current sensor of claim 8, wherein the coil windings are coupled in series.

10. The split core current sensor of claim 8, wherein the plurality of turns of each coil winding extends circumferentially along a respective core section 60° or less.

11. The split core current sensor of claim 8, wherein the plurality of turns of each coil winding extends circumferentially along a respective core section 50° or less.

12. The split core current sensor of claim 8, wherein the plurality of turns of each coil winding extends circumferentially along a respective core section 45° or less.

13. The split core current sensor of claim 8, wherein the plurality of turns of each coil winding extends circumferentially along a respective core section approximately 42°.

14. The split core current sensor of claim 8, wherein the central portion of the first core section and/or the second core section that is free of coil windings has a surface area of greater than or equal to 30% of a total surface area of the respective first core section and/or second core section.

15. The split core current sensor of claim 8, wherein the central portion of the first core section and/or the second core section that is free of coil windings has a surface area of greater than or equal to 40% of a total surface area of the respective first core section and/or second core section.

16. The split core current sensor of claim 8, wherein the central portion of the first core section and/or the second core section that is free of coil windings has a surface area of greater than or equal to 50% of a total surface area of the respective first core section and/or second core section.

17. The split core current sensor of claim 9, wherein the split core current sensor is a toroid.

18. The split core current sensor of claim 9, further comprising a housing constructed to receive the first and second core sections and the plurality of coil windings; and a waterproof resin encapsulating and hermetically sealing the first and second core sections and the plurality of coil windings within the housing.

19. The split core current sensor of claim 18, wherein the housing is subdivided into a first housing section and a second housing section; wherein:

the first housing section is constructed to receive the first core section, a first portion of the plurality of coil windings and a first portion of the waterproof resin encapsulating and hermetically sealing the first core section and the first portion of the plurality of coil windings within the first housing section; and the second housing section is constructed to receive the second core section, a second portion of the plurality of coil windings and a second portion of the waterproof resin encapsulating and hermetically sealing the second core section and the second portion of the plurality of coil windings within the second housing section.

20. A method of manufacturing a split core current sensor, comprising:

a). providing a core having two core sections, each core section having a length extending from a first end to and a second end thereof and the at least two core sections are configured to be positioned around the elongated conductor with the first ends on one side of the elongated conductor and the second ends on an opposite side of the elongated conductor;

b). providing a plurality of coil windings, and mounting at least a first of the coil windings proximate the first end of one of the core sections; mounting at least a second of the coil windings proximate to the second end of the one of the core sections; mounting at least a third of the coil windings proximate to the first end of an other core section; and mounting at least a fourth of the coil windings proximate to the second end of the other core section, wherein each of the coil windings on each core section is formed as a plurality of turns that extend about and circumferentially along a length of a respective segment of the core section from a first terminal end of the coil winding adjacent a corresponding one of the first and second ends of the core section toward the opposite one of the first and second ends of the core section to an opposite second terminal end of the coil winding so that the second terminal ends of the coil windings on each core section are spaced apart from each other along each core section, leaving a central portion of each core section between the second terminal ends free of coil windings; and c). connecting the coil windings together in series.

21. The method of claim 20, further comprising:

d). receiving the core sections and coil windings mounted thereon in a housing formed of two sections.

22. The method of claim 20, further comprising:

e). encapsulating the core sections and corresponding coil windings together with the housing sections with a waterproof resin.

* * * * *